United States Patent
Hamilton et al.

(10) Patent No.: US 10,985,336 B1
(45) Date of Patent: Apr. 20, 2021

(54) OXYGEN SCAVENGING NANOPARTICLES FOR AIR-PROCESSED QUANTUM DOT LIGHT EMITTING DIODES

(71) Applicant: SHARP KABUSHIKI KAISHA, Sakai (JP)

(72) Inventors: Iain Hamilton, Oxford (GB); Edward Andrew Boardman, Abingdon (GB); Enrico Angioni, Oxford (GB); Tim Michael Smeeton, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/735,535

(22) Filed: Jan. 6, 2020

(51) Int. Cl.
H01L 51/50 (2006.01)

(52) U.S. Cl.
CPC ........ *H01L 51/502* (2013.01); *H01L 51/5024* (2013.01)

(58) Field of Classification Search
CPC .......................... H01L 51/502; H01L 51/5024
See application file for complete search history.

(56) References Cited

U.S. PATENT DOCUMENTS

| | | | | |
|---|---|---|---|---|
| 9,059,211 B2* | 6/2015 | Chudzik | ............... | H01L 29/517 |
| 9,156,940 B2 | 10/2015 | Evans et al. | | |
| 9,196,707 B2* | 11/2015 | Chudzik | ............... | H01L 29/517 |
| 9,520,573 B2* | 12/2016 | Zhou | ..................... | C09K 11/025 |
| 10,103,359 B2* | 10/2018 | Ramadas | ............... | B82Y 30/00 |
| 2004/0185198 A1* | 9/2004 | Sisson | ....................... | C08K 3/08 428/35.7 |
| 2014/0004232 A1 | 1/2014 | Foltynowicz et al. | | |
| 2014/0179040 A1* | 6/2014 | Ramadas | ............... | B32B 27/20 438/27 |

FOREIGN PATENT DOCUMENTS

| | | |
|---|---|---|
| EP | 3342841 A1 | 7/2018 |
| WO | 01/10948 A1 | 2/2001 |
| WO | 2018/109671 A1 | 6/2018 |

OTHER PUBLICATIONS

Hyungsuk Moon et al., "Stability of Quantum Dots, Quantum Dot Films, and Quantum Dot Light-Emitting Diodes for Display Applications"; Advanced Materials, 2019, 1804294; Jan. 2019.

* cited by examiner

*Primary Examiner* — Nicholas J Tobergte
(74) *Attorney, Agent, or Firm* — ScienBiziP, P.C.

(57) ABSTRACT

A light-emitting device includes a first electrode, a second electrode, and an emissive layer between the first and second electrodes, where the emissive layer comprises quantum dots and oxygen scavenging nanoparticles. The oxygen scavenging nanoparticles comprise at least one of one or more iron based materials, and one or more organic polymer based materials.

20 Claims, 10 Drawing Sheets

OXYGEN SCAVENGING NANOPARTICLES FOR AIR-PROCESSED QUANTUM DOT LIGHT EMITTING DIODES

FIELD

The present disclosure generally relates to light-emitting devices, and in particular to light-emitting devices including a photo-patterned emissive layer containing quantum dots having within the active layer oxygen scavenging nanoparticles. The light-emitting devices may be implemented in display applications, for example high resolution, multicolor displays. The invention further relates to methods of manufacturing said light-emitting devices and the arrangements thereof.

BACKGROUND

A common architecture for a light-emitting device includes an anode, which acts as a hole injector; a hole transport layer disposed on the anode; an emissive material layer disposed on the hole transport layer; an electron transport layer disposed on the emissive material layer; and a cathode, which also acts as an electron injector, disposed on the electron transport layer. When a forward bias is applied between the anode and cathode, holes and electrons are transported in the device through the hole transport layer and electron transport layer, respectively. The holes and electrons recombine in the emissive material layer, which emits light.

When the emissive material layer includes an organic material, the light-emitting device is referred to as an organic light-emitting diode (OLED). When the emissive material layer includes nanoparticles, sometimes known as quantum dots (QDs), the device is commonly called either a quantum dot light-emitting diode (QLED, QD-LED) or an electroluminescent quantum dot light-emitting diode (ELQLED). Quantum dots generally include ligands bound to their outer surface. The ligands allow the quantum dots to be solution processed, and may provide for the passivation of the quantum dot surface to which the ligands are bound.

In order to include QLEDs in multicolor high-resolution displays, different manufacturing methods have been designed. These methods are based on disposing three different types of quantum dots in three different regions of a substrate such that they emit (through electrical injection, i.e., by electroluminescence) at three different colors: red (R), green (G), and blue (B). Sub-pixels that respectively emit red, green, or blue light may collectively form a pixel, which in-turn may be a part of an array of pixels of the display.

Using quantum dots in the emissive layer may offer advantages such as potential for longer operating lifetime, operation at higher current densities, and narrow spectral emission profiles allowing for high color purity. Also, a wide range of different colors may be achieved by controlling the size and composition of the quantum dots. In addition, quantum dots may be solution processed, which is an advantage over vacuum-deposited organic materials. For large scale production of quantum dot based displays to be low cost, it is preferable if fabrication occurs in an ambient environment. This is a challenge as quantum dots are sensitive to oxygen and moisture, and can rapidly degrade in ambient environments. Therefore, there is a need to find a way to fabricate high efficiency QLEDs in an ambient environment without affecting device performance and lifetime, which is what the present invention seeks to address.

United States Patent Application Publication No. U.S. Pat. No. 9,156,940 B2 (Evans et al. published 13 Oct. 2015) is a patent that covers using oxygen scavenging polymers and other plastic polymer compositions to reduce oxygen in an ambient environment as well as being used as a barrier to prevent oxygen ingress. This is typically used in packaging for food but can be used in other applications.

United States Patent Application Publication No. US 2014/0004232 (Foltynowicz et al. published 2 Feb. 2014) details a method of forming iron-boron nanoparticle composites as oxygen scavengers in both solid plastic materials and within solutions. The nanoparticles are able to efficiently remove oxygen from the ambient environment.

International Patent Application Publication No. WO 2018/109671 A1 (Lee et al., published 21 Jun. 2018) describes a method of forming a quantum dot film that is well-protected against oxygen by depositing between two layers consisting of barrier polymers mixed with oxygen scavengers.

European Patent Application Publication No. EP 3,342,841 A1 (Zhao et al., 4 Jul. 2018) details method of forming a semiconductor quantum dot with multiple insulator coatings to protect core from moisture and oxygen.

International Patent Application Publication No. WO 01/10948 A1 (Clauberg et al., 15 Feb. 2001) describes oxygen scavenging organic cations to platelet particles, and can be incorporated into polymer composites to act as a barrier to oxygen as well as reducing atmospheric oxygen.

Moon et al., Stability of Quantum Dots, *Quantum Dot Films, and Quantum Dot Light-Emitting Diodes for Display Applications*, Advanced Materials, 2019, 1804294, is a review paper that gives an overview of the stability of quantum dots in ambient conditions. Suggested improvements to stability in air include altering quantum dot shell thickness, adding an intermediary shell layer, ligand engineering and quantum dot encapsulation.

CITATION LIST

U.S. Pat. No. 9,156,940 B2 (Evans et al., published Oct. 13, 2015).

U.S. Pat. App. Pub. No. US 2014/0004232 (Foltynowicz et al. published Feb. 2, 2014).

International Pat. App. Pub. No. WO 2018/109671 A1 (Lee et al., published Jun. 21, 2018).

European Pat. App. Pub. No. EP 3,342,841 A1 (Zhao et al., published Jul. 4, 2018).

International Pat. App. Pub. No. WO 01/10948 A1 (Clauberg et al., published Feb. 15, 2001).

Moon et al., Stability of Quantum Dots, *Quantum Dot Films, and Quantum Dot Light-Emitting Diodes for Display Applications*, Advanced Materials, 2019, 1804294.

SUMMARY

The present disclosure is directed to oxygen scavenging nanoparticles for air-processed quantum dot light emitting diodes.

The ability to deposit the quantum dots that emit different colors in sub-pixel patterns of light emitting devices is a requirement to fabricate high resolution display applications. It is also desirable for fabrication of displays to happen in an ambient environment to allow manufacture to be low cost. Quantum dots are very sensitive to both oxygen and moisture and thus it is currently not viable to fabricate in an ambient environment without observing a significant decrease in device performance (e.g. device efficiency or device operating lifetime). The present disclosure details a structure for a light emitting device with sub-pixel arrangement using emissive layers quantum dots blended with oxygen scavenging nanoparticles, and a method for fabricating the structure. The method may allow for fabrication of patterned sub-pixels in an ambient environment by the oxygen scavengers reducing the amount of oxygen that could cause degradation of the quantum dot.

The light emitting device produced according to this disclosure may possess one or more improved properties. For example, the long-term stability and the performance of the light emitting device may be improved by use of a suitable oxygen scavenger and blend composition; for example, the addition of Pt or Fe containing nanoparticles that will react with oxygen in place of emissive quantum dots. The use of organic or inorganic oxygen scavenging particles within the emissive layer mixture will (i) improve device performance by reducing the oxidation of emissive quantum dots, (ii) allow for fabrication of quantum dot displays in an ambient environment thereby reducing manufacture cost and (iii) by blending in the oxygen scavenger into the emissive layer mixture this allows for good performance and ease of fabrication.

In accordance with one aspect of the present disclosure, a light-emitting device includes a first electrode, a second electrode, and an emissive layer between the first and second electrodes, where the emissive layer comprises quantum dots and oxygen scavenging nanoparticles.

In some implementations, the oxygen scavenging nanoparticles comprise one or more iron based materials.

In some implementations, the oxygen scavenging nanoparticles comprise one or more organic polymer based materials.

In some implementations, the oxygen scavenging nanoparticles become passive after being oxidized, and do not interfere with normal operations of the light emitting device.

In some implementations, the light-emitting device also includes an electron injection layer disposed between the first electrode and the emissive layer, wherein the first electrode is a negative electrode.

In some implementations, the light-emitting device also includes a hole injection layer disposed between the second electrode and the emissive layer, wherein the second electrode is a positive electrode.

In some implementations, the light-emitting device also includes an electron transport layer disposed between the first electrode and the emissive layer, wherein the first electrode is a negative electrode.

In some implementations, the light-emitting device also includes a hole transport layer disposed between the second electrode and the emissive layer, wherein the second electrode is a positive electrode.

In some implementations, the oxygen scavenging nanoparticles are phase separated from the quantum dots in the emissive layer.

In some implementations, the oxygen scavenging nanoparticles and the quantum dots are randomly dispersed in the emissive layer.

In some implementations, the quantum dots and the oxygen scavenging nanoparticles are arranged in an electron transporting organic matrix in the emissive layer.

In some implementations, the quantum dots and the oxygen scavenging nanoparticles are arranged in a hole transporting organic matrix in the emissive layer.

In some implementations, the emissive layer further comprises one or more hole transporting molecules, and the quantum dots and the oxygen scavenging nanoparticles are cross-linked to one another and with at least one of the one or more hole transporting molecules.

In some implementations, the emissive layer further comprises one or more electron transporting molecule, and the quantum dots and the oxygen scavenging nanoparticles are cross-linked to one another and with at least one of the one or more electron transporting molecules.

In accordance with another aspect of the present disclosure, a light-emitting device includes an anode electrode, a cathode electrode, and an emissive layer in electrical contact with the anode electrode and cathode electrode, where the emissive layer comprises quantum dots and oxygen scavenging nanoparticles configured to prevent the quantum dots from oxidation.

In some implementations, the oxygen scavenging nanoparticles comprise at least one of one or more iron based materials, and one or more organic polymer based materials.

In some implementations, the quantum dots and the oxygen scavenging nanoparticles are arranged in a hole transporting organic matrix in the emissive layer.

In some implementations, the quantum dots and the oxygen scavenging nanoparticles are arranged in an electron transporting organic matrix in the emissive layer.

In some implementations, the oxygen scavenging nanoparticles and the quantum dots are randomly dispersed in the emissive layer.

BRIEF DESCRIPTION OF THE DRAWINGS

Aspects of the example disclosure are best understood from the following detailed description when read with the accompanying figures. Various features are not drawn to scale. Dimensions of various features may be arbitrarily increased or reduced for clarity of discussion.

DETAILED DESCRIPTION

Figure 1:
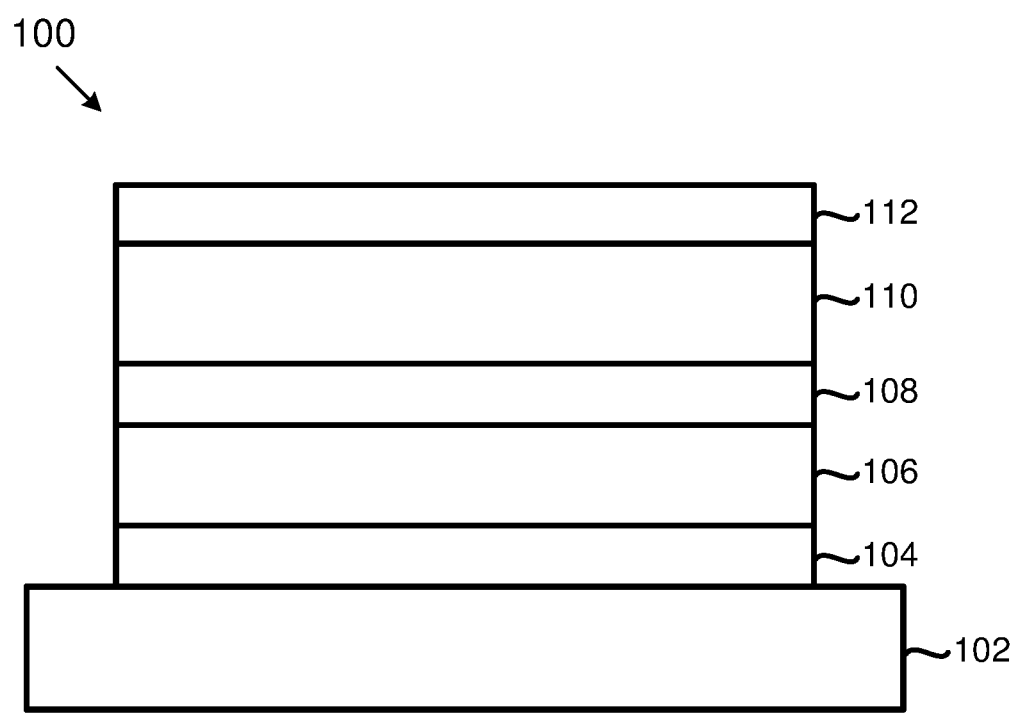
FIG. 1 is a schematic cross-sectional view of a light-emitting device in accordance with an example implementation of the present disclosure.

The following description contains specific information pertaining to example implementations in the present disclosure. The drawings in the present disclosure and their accompanying detailed description are directed to merely example implementations. However, the present disclosure is not limited to merely these example implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purpose of consistency and ease of understanding, like features may be identified (although, in some examples, not shown) by the same numerals in the example figures. However, the features in different implementations may be differed in other respects, and thus shall not be narrowly confined to what is shown in the figures.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising," when utilized, means "including, but not necessarily limited to"; it specifically indicates open-ended inclusion or membership in the so-described combination, group, series and the equivalent. The expression "at least one of A, B and C" or "at least one of the following: A. B and C" means "only A, or only B, or only C, or any combination of A. B and C."

Additionally, for the purposes of explanation and non-limitation, specific details, such as functional entities, techniques, protocols, standard, and the like are set forth for providing an understanding of the described technology. In other examples, detailed description of well-known methods, technologies, systems, architectures, and the like are omitted so as not to obscure the description with unnecessary details.

FIG. 1 is a schematic cross-sectional view of a light-emitting device 100 in accordance with an example implementation of the present disclosure. As shown, a stack of layers is provided on a substrate 102. In the present implementation, the layers are stacked on a major surface of the substrate in a direction orthogonal to the plane of the major surface. The layers include electrodes 104 and 112 (e.g., an anode and a cathode), charge transport layers 106 and 110 (e.g., a hole transport layer and an electron transport layer), and an emissive layer 108. In the example implementation shown, the charge transport layers 106 and 110 are disposed between the electrodes 104 and 112, and the emissive layer 108 is disposed between the charge transport layers 106 and 110.

In some implementations, such as the one shown, the stack is formed such that the anode is proximate the substrate. Accordingly, in the illustrated implementation, the order of the layers moving away from the substrate 102 is an anode 104, a hole transport layer 106, an emissive layer 108, an electron transport layer 110, and a cathode 112. Although not specifically shown, in other implementations, the layers may be stacked on the substrate 102 in reverse order such that the cathode is proximate the substrate 102.

During operation, a bias may be applied between the anode 104 and cathode 112. The cathode 112 may inject electrons into the electron transport layer 110 adjacent to it. Likewise, the anode 104 may inject holes into the hole transport layer 106 adjacent to it. The electrons and holes respectively propagate through the hole transport layer 106 and the electron transport layer 110 to the emissive layer 108 where they radiatively recombine, and light is emitted. In some implementations, light may be emitted out of the substrate 102 side. In other implementations, light may be emitted out of the cathode 112 side. In other implementations, light may be emitted out of both the substrate 102 side and the cathode 112 side.

The substrate 102 may be made from any suitable material(s). Exemplary substrates may include glass substrates and polymer substrates. More specific examples of substrate material(s) may include polyimides, polyethenes, polyethylenes, polyesters, polycarbonates, polyethersulfones, polypropylenes, and/or polyether ether ketones. The substrate 102 may be of any suitable shape and size. In some implementations, the dimensions of the substrate 102 allow for more than one light-emitting device to be provided thereon. In an example, a major surface of the substrate 102 may provide an area for multiple light-emitting devices to be formed as sub-pixels of a pixel. In another example, a major surface of the substrate 102 may provide an area for multiple pixels (e.g., an array of pixels) to be formed thereon, each pixel including a sub-pixel arrangement of light-emitting devices.

The electrodes 104 and 112 (e.g., an anode and a cathode) may be formed from any suitable material(s). In some implementations, at least one of the electrodes 104 and 112 is a transparent or semi-transparent electrode. In some implementations, at least one of the electrodes 104 and 112 is a reflective electrode. In some implementations, one of the electrodes 104 and 112 is a transparent or semi-transparent electrode and the other electrode is a reflective electrode. Exemplary electrode materials may include one or more metals (e.g., aluminum, gold, silver, platinum, magnesium, and the like and alloys thereof) or metal oxides (e.g., indium tin oxide, indium-doped zinc oxide (IZO), fluorine doped tin oxide (FTO), aluminum-doped zinc-oxide (AZO), indium-doped cadmium-oxide, and the like). The electrodes 104 and 112 may also be provided in any suitable arrangement. As an example, the electrodes 104 and 112 may address a thin-film transistor (TFT) circuit.

The hole transport layer 106 may include one or more layers configured to transport holes there through from the anode 104 to the emissive layer 108. The hole transport layer 106 may be made from any suitable material(s). In some implementations, the hole transport layer 106 may include one or more of poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (poly-TPD), metal oxide materials (e.g., $V_2O_5$, NiO, CuO, $WO_3$, and/or $MoO_3$), and organic small molecule materials (e.g., 2,3,5,6-tetrafluoro-7,7,8,8-tetracyanoquinodimethane (F4TCNQ), 1,4,5,8,9,11-hexaazatriphenylenehexacarbonitrile(HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), and/ or N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC)). In implementations where the hole transport layer 106 includes more than one layer, the material of one of the respective layers may differ from the material of one or more of the other layers. In other implementations where the hole transport layer 106 includes more than one layer, the material of the respective layers may be the same.

The electron transport layer 110 may include one or more layers configured to transport electrons there through from the cathode 112 to the emissive layer 108. The electron transport layer 110 may be made from any suitable material(s). In some implementations, the electron transport layer 110 may include one or more metal oxides (e.g., ZnO, $Mg_xZn_{1-x}O$ where $0 \leq x \leq 1$, $Al_xZn_{1-x}O$ where $0 \leq x \leq 1$, $TiO_2$, $ZrO_2$, and the like), organic small molecules (e.g., 2,2',2"-(1,3,5-benzinetriyl)-tris(1-phenyl-1-H-benzimidazole) (TPBi), N4,N4'-Di(naphthalen-1-yl)-N4,N4'-bis(4-vinylphenyl)biphenyl-4,4'-diamine (VNPB), 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), and the like), and thin ionic interlayers (e.g., 8-quinolinolato lithium (Liq.), LiF, $Cs_2CO_3$, and the like). In implementations where the electron transport layer 110 includes more than one layer, the material of one of the respective layers may differ from the material of one or more of the other layers. In other implementations where the electron transport layer 110 includes more than one layer, the material of the respective layers may be the same.

Figure 3:
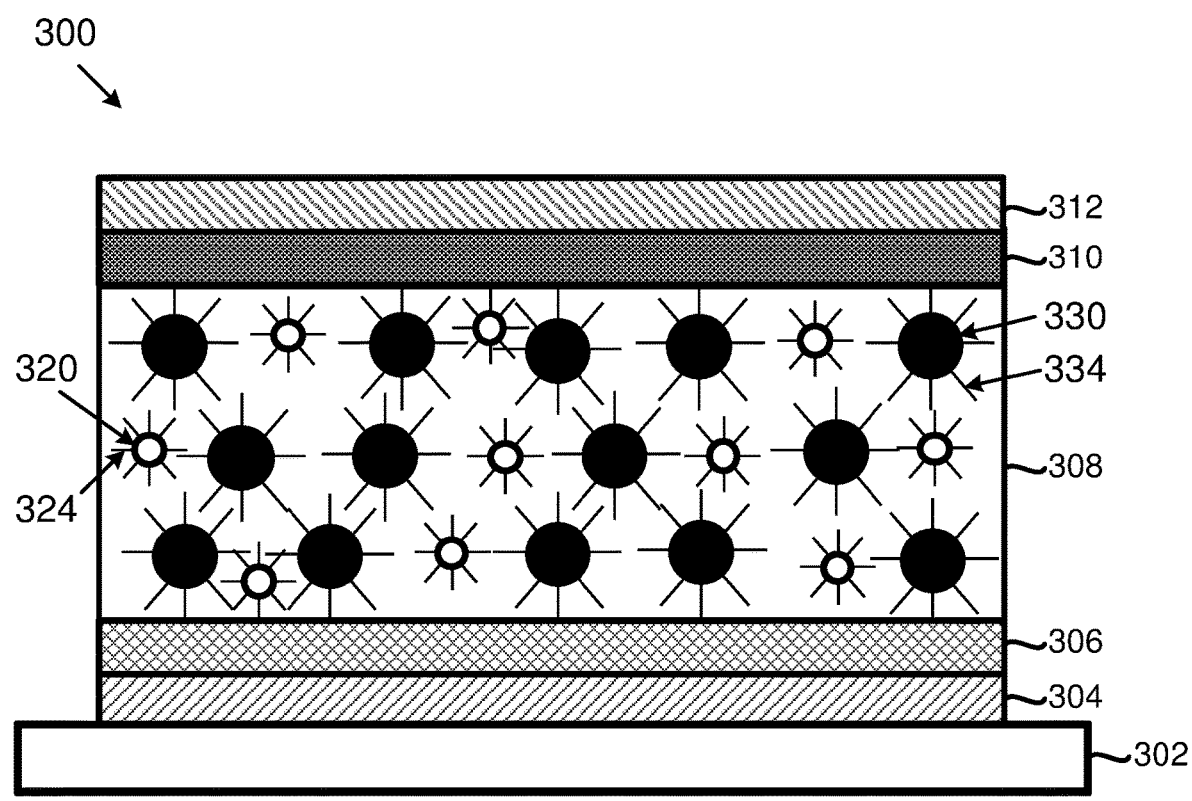
FIG. 3 is a schematic diagram of a light-emitting device comprising an emissive layer having a mixture of emissive quantum dots and oxygen scavenging nanoparticles in accordance with an example implementation of the present disclosure.

The emissive layer 108 may contain emissive quantum dots (e.g., quantum dots 330 in FIG. 3). Exemplary quantum dot materials of the emissive layer 108 (e.g., core and/or shell materials) may include, but are not limited to, one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, $ZnS_{1-x}Te_x$, ZnTe, $ZnSe_{1-x}Te_x$, InAs, ZnO, MgO, HgS perovskites of the form $ABX_3$, $Zn_wCu_zIn_{1-(w+z)}S$, and carbon, where $0 \leq w, x, y, z \leq 1$ and $(w+z) \leq 1$. It is understood that the quantum dot materials may include other elements as dopants or alloys. For example, a quantum dot including InP may include a material substantially comprising InP but also including As and/or other elements as dopant or alloy components. The quantum dots may be embodied as nanoparticles. Exemplary core-shell quantum dots may include CdSe/CdS, CdSe/ZnS, InAs/CdSe, ZnO/MgO, CdS/HgS, CdS/CdSe, ZnSe/CdSe, MgO/ZnO, ZnTe/CdSe, CdTe/CdSe, CdS/ZnSe, and the like. In other implementations, the quantum dots may each include a core, a shell around the core, and an oxide layer (e.g., an $Al_2O_3$ layer or a layer of another suitable metal oxide). In other exemplary implementations (not specifically shown), the quantum dots may each include only a core. The quantum dots may also contain long chain ligands (e.g., ligands 334 in FIG. 3), to aid their dissolution within a solvent. Suitable ligands and solvents will be discussed below, and may be substantially the same as for the oxygen scavenging nanoparticles.

In various implementations of the present disclosure, the hole transport layer 106, emissive layer 108 and electron transport layer 110 may be solution processed, and thin films may be formed by any suitable method including, but not limited to, spin coating, blade coating, inkjet printing, wire bar coating, slot die coating, gravure printing, screen printing and drop casting.

It should be noted that, while FIG. 1 shows the example light-emitting device 100 including the hole transport layer 106 and the electron transport layer 110, it will be appreciated that in other implementations (not specifically shown), one or both of these layers may be omitted from the light-emitting device. For example, according to some implementations of the present application, a light-emitting device may include a number of layers, where the order of the layers moving away from the substrate 102 may be an anode 104, an emissive layer 108, an electron transport layer 110, and a cathode 112 (or these layers may be stacked on the substrate in reverse order such that the cathode is proximate the substrate).

In another example, according to some implementations of the present application, a light-emitting device may include a number of layers, where the order of the layers moving away from the substrate 102 may be an anode 104, a hole transport layer 106, an emissive layer 108, and a cathode 112 (or these layers may be stacked on the substrate in reverse order such that the cathode is proximate the substrate).

In another example, according to some implementations of the present application, a light-emitting device may include a number of layers, where the order of the layers moving away from the substrate 102 may be an anode 104, an emissive layer 108, and a cathode 112 (or these layers may be stacked on the substrate in reverse order such that the cathode is proximate the substrate).

In various implementations of the present disclosure, the emissive layer 108 may include emissive quantum dots as well as non-emissive oxygen scavenging nanoparticles to prevent oxidation and/or degradation of the quantum dots.

Figure 2:
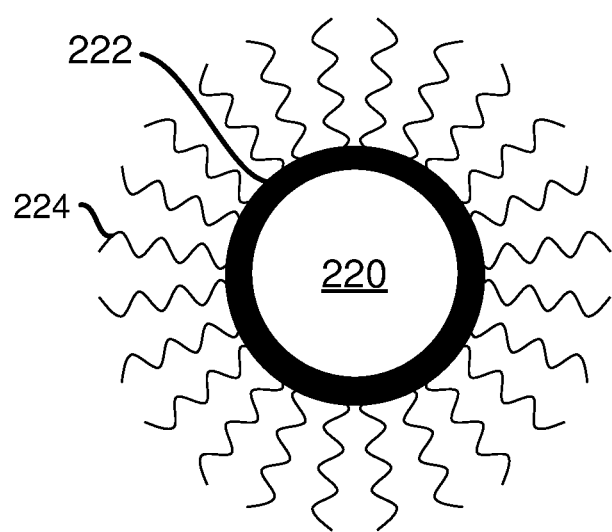
FIG. 2 is a schematic diagram of an oxygen scavenging nanoparticle in accordance with an example implementation of the present disclosure.

FIG. 2 is a schematic diagram of an oxygen scavenging nanoparticle 220 in accordance with an example implementation of the present disclosure. The oxygen scavenging nanoparticle 220 includes oxygen scavenging materials. In some implementations, the oxygen scavenging materials may be based on an iron core. Such examples may include montmorillonite-supported iron ($Fe^0$) nanoparticles or $Fe^2$ based iron nanoparticles.

In some implementations, the oxygen scavenging nanoparticle 220 may contain a thin outer shell 222. In some implementations, the thin outer shell 222 may be optional for the oxygen scavenging nanoparticle 220.

Iron-based oxygen scavenging nanoparticles remove oxygen by the following reactions:

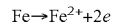
$$Fe \rightarrow Fe^{2+} + 2e$$

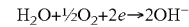
$$H_2O + \tfrac{1}{2}O_2 + 2e \rightarrow 2OH^-$$

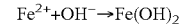
$$Fe^{2+} + OH^- \rightarrow Fe(OH)_2$$

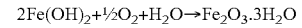
$$2Fe(OH)_2 + \tfrac{1}{2}O_2 + H_2O \rightarrow Fe_2O_3 \cdot 3H_2O$$

Thus, the presence of iron oxide may determine the extent at which oxygen scavenging has occurred.

In some implementations, the oxygen scavenging material may be organic polymer nanoparticles including at least one of a suitable backbone such as copolyesters (e.g., polyethylene terephthalate ("PET), polybutylene terephthalate ("PBT"), polyethylene naphthalate ("PEN"), polybutylene naphthalate ("PBN")); polycarbonates; poly(ethyleneoxides); polyurethanes; polyepoxides; polystyrenes; polyamides. This is to be coupled with side chains containing (i) a divalent organic linking group, (ii) an oxygen scavenging group and (iii) a hydrogen atom. Suitable linking groups may include an ester, amide or ether linking groups. Suitable oxygen scavenging groups may include conjugated and non-conjugated alkenyl groups, more preferably alkenyl groups having two or more carbon-carbon double bonds.

The alkenyl group may be linear or branched. The oxygen scavenging ability of organic based nanoparticles is based on the carbon-carbon double bonds present in the chemical structure which are exposed and thus available for oxidation. Thus, the presence of ketones and other carbon-oxygen structures can give indication if oxygen has been scavenged by these particular nanoparticles. Thus, in these implementations the number of carbon-carbon double bond side chains present in the nanoparticles is an important factor in determining its oxygen scavenging capacity. A sufficient number of carbon-carbon double bonds should preferably be present for the nanoparticle to perform adequately, and for a suitable length of time. In some implementations, the reactivity rate of the oxygen scavenging sidechains may be adjusted to tailor the oxygen scavenging properties of the composition.

One aspect of the present disclosure is that the oxygen scavenging nanoparticles become passive after oxidation, and do not interfere with the normal operation of the light emitting device. This may be achieved, for example, in iron based nanoparticles since a shell of iron oxide will form on the outer layer of the quantum dot, which can prevent charge transport to the oxygen scavenger rather than the emissive quantum dot. Similarly, the organic polymer based nanoparticle will have a non-conjugated backbone, and thus have a wide bandgap including a large ionization potential and small electron affinity. This too will prevent the transfer of charge to the oxygen scavenger due to large energetic barriers.

The oxygen scavenging nanoparticle 220 may also contain solubilizing ligands 224 that allow the nanoparticle to be dissolved in a range of solvents and co-solvents to allow blending with emissive quantum dots. Exemplary ligands may involve long chain carbon atoms (between 8-20 carbons in length) and contain a functional group to bind to the nanoparticle. Such examples include long chain carboxylic acids (e.g. oleic acid), thiols (e.g. dodecanethiol), amines (oleylamine) and phosphines (trioctylphosphine). Exemplary solvents that the oxygen scavenging nanoparticle 220 may be dissolved in may include, but are not limited to, the following or mixtures including the following: acetone, dichloromethane, chloroform, linear or branched alkyl acetates (e.g., ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 10 atoms of carbon (e.g., butanol, 2-propanol, propanol, ethanol, methanol), linear or branched alkoxy alcohols with 2 to 10 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene).

FIG. 3 is a schematic diagram of a light-emitting device 300 comprising an emissive layer having a mixture of emissive quantum dots and oxygen scavenging nanoparticles in accordance with an example implementation of the present disclosure. As shown in FIG. 3, in one implementation, the light-emitting device 300 may include a substrate 302, an electrode 304, a charge transport layer 306, an emissive layer 308, a charge transport layer 310, and an electrode 312. In some implementations, the substrate 302, electrode 304, charge transport layer 306, emissive layer 308, charge transport layer 310, and electrode 312 may substantially correspond to the substrate 102, electrode 104, charge transport layer 106, emissive layer 108, charge transport layer 110, and electrode 112, respectively, in FIG. 1.

In some implementations, the composition of the emissive layer 308 is such that the layer consists of a mixture of emissive quantum dots 330 and oxygen scavenging nanoparticles 320. In some implementations, the oxygen scavenging nanoparticles 320 may each correspond to the oxygen scavenging nanoparticles 220 in FIG. 2. The emissive layer 308 may comprise 0.1-50 wt % oxygen scavenging nanoparticles 320. In the implementation shown in FIG. 3, the emissive quantum dots 330 may include ligands 334, and the oxygen scavenging nanoparticles 320 may include ligands 324.

Figure 4A:
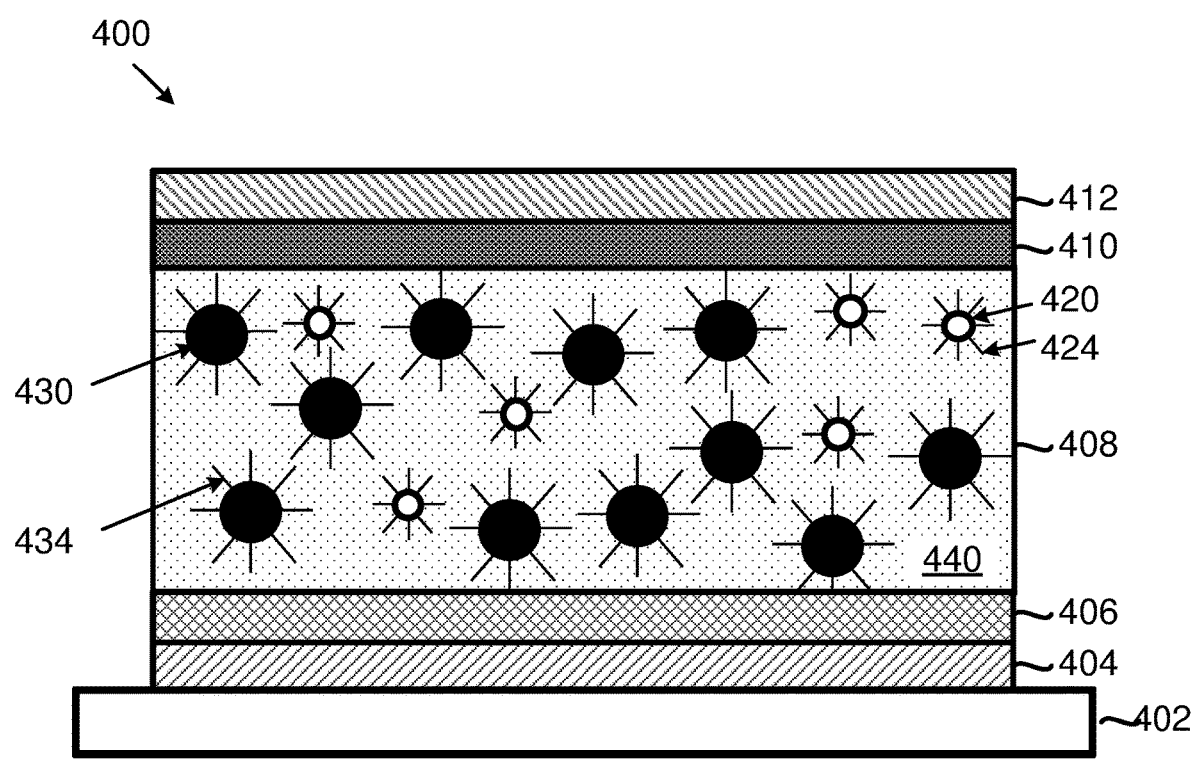
FIG. 4A is a schematic cross-sectional view of a light-emitting device comprising an emissive layer having emissive quantum dots and oxygen scavenging nanoparticles within a cross-linked charge transporting matrix in accordance with an example implementation of the present disclosure.

FIG. 4A is a schematic cross-sectional view of a light-emitting device 400 comprising an emissive layer having emissive quantum dots and oxygen scavenging nanoparticles within a cross-linked charge transporting matrix in accordance with an example implementation of the present disclosure. As shown in FIG. 4A, in one implementation, the light-emitting device 400 may include a substrate 402, an electrode 404, a charge transport layer 406, an emissive layer 408, a charge transport layer 410, and an electrode 412. In some implementations, the substrate 402, electrode 404, charge transport layer 406, emissive layer 408, charge transport layer 410, and electrode 412 may substantially correspond to the substrate 102, electrode 104, charge transport layer 106, emissive layer 108, charge transport layer 110, and electrode 112, respectively, in FIG. 1.

In some implementations, oxygen scavenging nanoparticles and emissive quantum dots are blended with a charge transport material. As shown in FIG. 4A, the emissive layer 408 may include emissive quantum dots 430 (having ligands 434) and oxygen scavenging nanoparticles 420 (having ligands 424) within a charge transport matrix 440. In some implementations, the oxygen scavenging nanoparticles 420 may each correspond to the oxygen scavenging nanoparticles 220 in FIG. 2. In some implementations, the quantum dots 430 may be randomly dispersed in the emissive layer 408. In some other implementations, the quantum dots 430 may be uniformly dispersed in the emissive layer 408. The emissive layer 408 is advantageous to device performance as the matrix may aid in planarizing the emissive layer 408 and reducing roughness, which may in turn aid in improving charge transport, reducing operating voltage and increasing device efficiency.

In some implementations, the charge transport material is cross linkable or cross linked (for example OTPD mentioned above or cross linked OTPD). This is advantageous when fabricating multiple red, green and blue light emitting devices on a single substrate as areas can be selectively photopatterned using ultraviolet light via polymerization of organic monomers optionally in the presence of a photoinitiator. A suitable solvent to which the charge transport materials are soluble in can then be used to wash away unexposed areas.

Figure 4B:
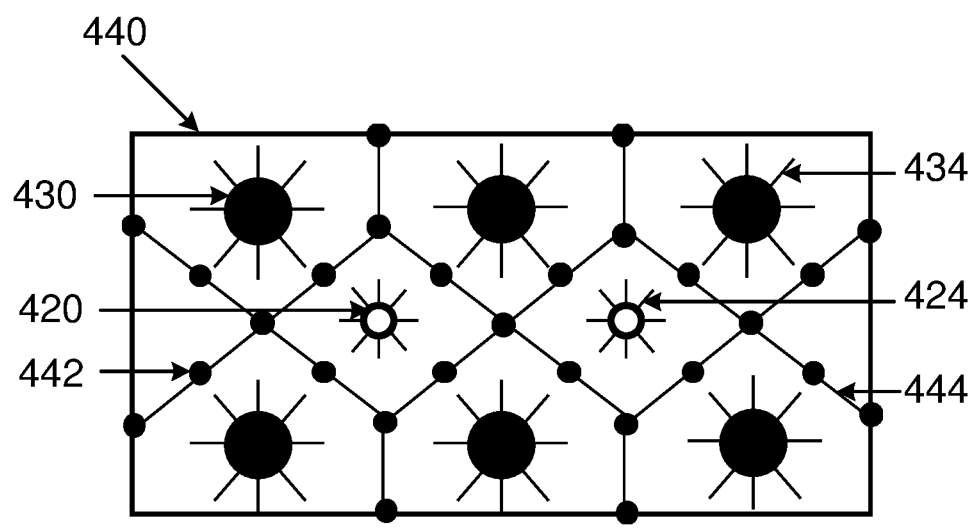
FIG. 4B is a schematic diagram of a cross-sectional view of a charge transport matrix in accordance with an example implementation of the present disclosure.

FIG. 4B is a schematic diagram of a cross-sectional view of a charge transport matrix 440 in accordance with an example implementation of the present disclosure. In one implementation, the charge transport matrix 440 may correspond to the charge transport matrix 440 in FIG. 4A. In FIG. 4B, individual charge transport molecules 442 are shown as linked to each other via covalent bonds 444, while the quantum dots 430 having ligands 434 and oxygen scavenging nanoparticles 420 having ligands 424 are dispersed within the charge transport matrix 440. It should be noted that, in some implementations, the quantum dots 430 and/or oxygen scavenging nanoparticles 420 may be cross-linked with the individual charge transport molecules 442 in the charge transport matrix 440.

Figure 5:
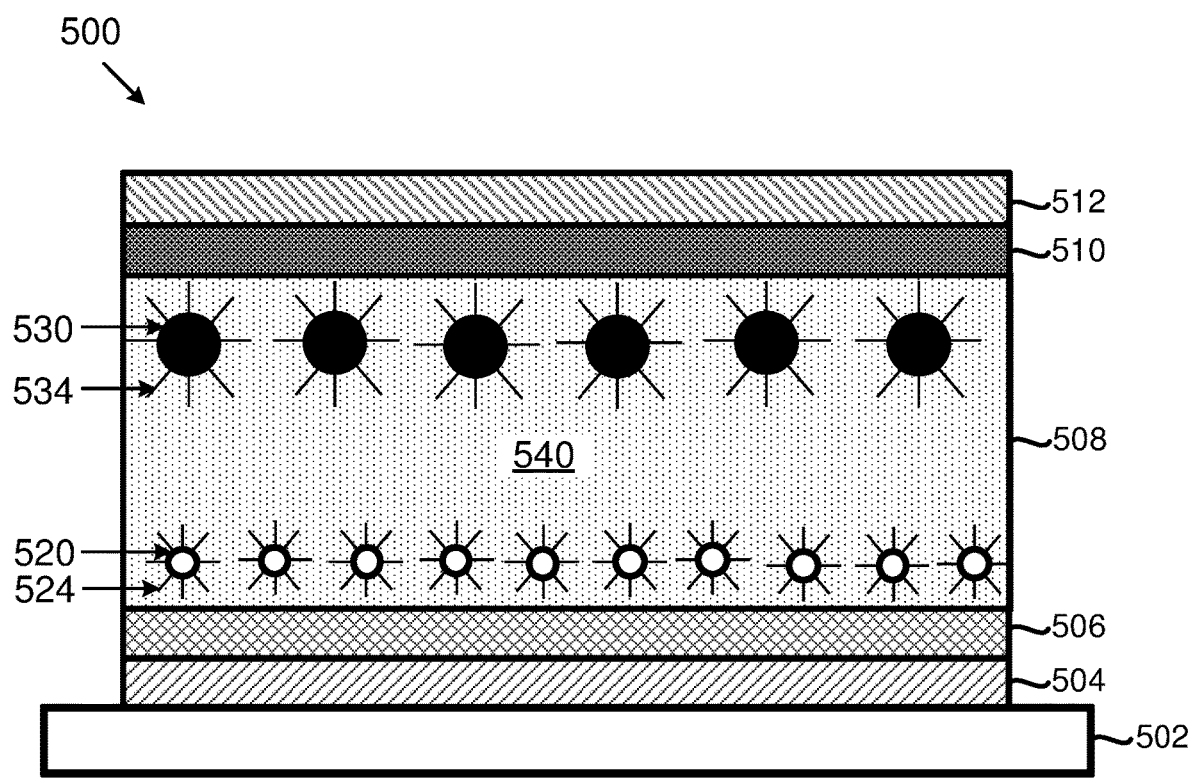
FIG. 5 is a schematic cross-sectional view of a light-emitting device comprising an emissive layer having oxygen scavenging nanoparticles phase separated from quantum dots in accordance with an example implementation of the present disclosure.

FIG. 5 is a schematic cross-sectional view of a light-emitting device 500 comprising an emissive layer having oxygen scavenging nanoparticles phase separated from quantum dots in accordance with an example implementation of the present disclosure. As shown in FIG. 5, in one implementation, the light-emitting device 500 may include a substrate 502, an electrode 504, a charge transport layer 506, an emissive layer 508, a charge transport layer 510, and an electrode 512. In some implementations, the substrate 502, electrode 504, charge transport layer 506, emissive layer 508, charge transport layer 510, and electrode 512 may substantially correspond to the substrate 102, electrode 104, charge transport layer 106, emissive layer 108, charge transport layer 110, and electrode 112, respectively, in FIG. 1.

In some implementations, as shown in FIG. 5, emissive quantum dots 530 (having ligands 534) and/or oxygen scavenging nanoparticles 520 (having ligands 524) may phase separate from a matrix 540 (e.g., an organic matrix) which may be promoted via the choice of ligands, size of nanoparticles/quantum dots, choice of hole transport matrix and material upon which the layer is to be deposited. In some implementations, the oxygen scavenging nanoparticles 520 may each correspond to the oxygen scavenging nanoparticles 220 in FIG. 2.

The phase separation may be carried out in such a way to form a barrier of oxygen scavenging nanoparticles at a particular interface within a device to stop ingress of oxygen or water into that particular layer. For example, as shown in FIG. 5, the oxygen scavenging nanoparticles 520 may be phase separated from the organic matrix 540, such that the oxygen scavenging nanoparticles 520 may form a sublayer, in the emissive layer 508, near an interface between the emissive layer 508 and the charge transport layer 506. Also, the emissive quantum dots 530 may be phase separated from the organic matrix 540, such that the emissive quantum dots 530 may form another sublayer, in the emissive layer 508, near an interface between the emissive layer 508 and the charge transport layer 510.

It should be understood that, in some implementations, the positions of the sublayers of the emissive quantum dots 530 and oxygen scavenging nanoparticles 520 may be reversed.

Figure 6:
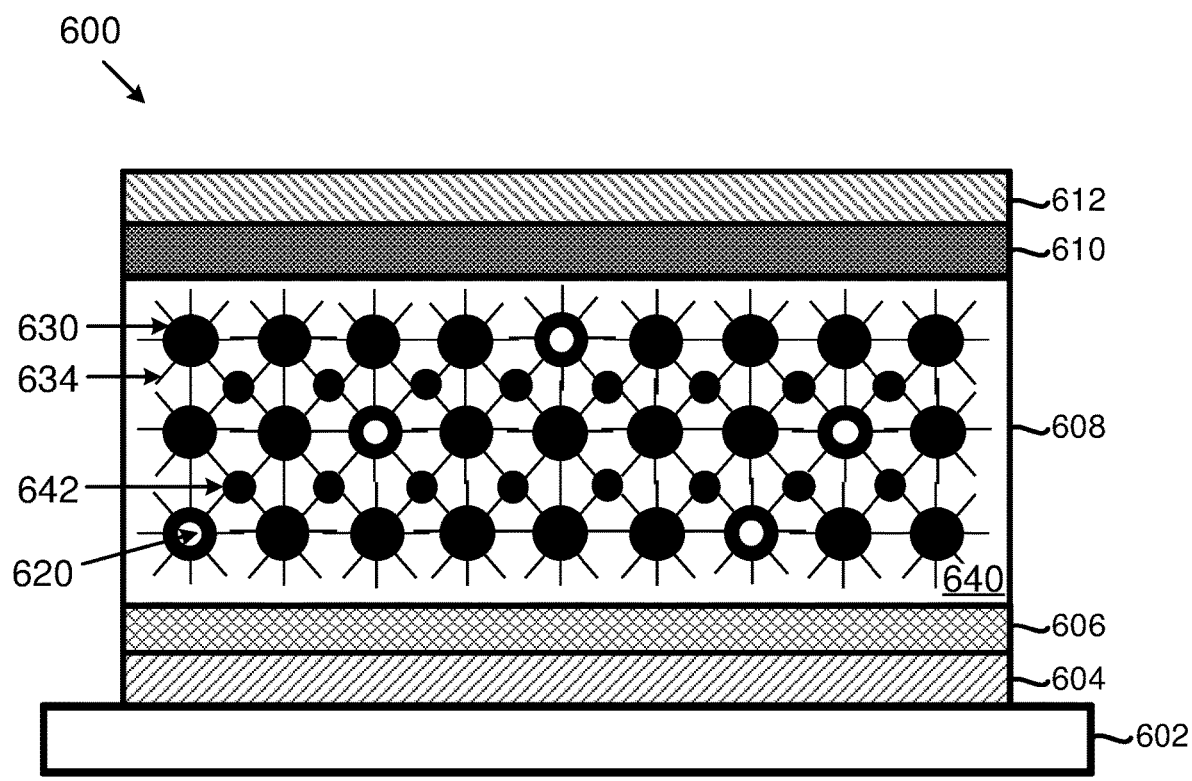
FIG. 6 is a schematic cross-sectional view of a light-emitting device comprising an emissive layer having oxygen scavenging nanoparticles and emissive quantum dots cross-linked with each other by cross-linkable ligands and with a charge transport matrix in accordance with an example implementation of the present disclosure.

FIG. 6 is a schematic cross-sectional view of a light-emitting device 600 comprising an emissive layer having oxygen scavenging nanoparticles and emissive quantum dots cross-linked with each other by cross-linkable ligands and with a charge transport matrix in accordance with an example implementation of the present disclosure. As shown in FIG. 6, in one implementation, the light-emitting device 600 may include a substrate 602, an electrode 604, a charge transport layer 606, an emissive layer 608, a charge transport layer 610, and an electrode 612. In some implementations, the substrate 602, electrode 604, charge transport layer 606, emissive layer 608, charge transport layer 610, and electrode 612 may substantially correspond to the substrate 102, electrode 104, charge transport layer 106, emissive layer 108, charge transport layer 110, and electrode 112, respectively, in FIG. 1.

In some implementations, oxygen scavenging nanoparticles and/or emissive quantum dots may include cross-linkable ligands that, under UV exposure, may cross link with each other and with a charge transport matrix. As shown in FIG. 6, emissive quantum dots 630 includes cross-linkable ligands 634. Oxygen scavenging nanoparticles 620 includes cross-linkable ligands 624. In some implementations, the oxygen scavenging nanoparticles 620 may each correspond to the oxygen scavenging nanoparticles 220 in FIG. 2. Under UV exposure, the ligands 634 of the emissive quantum dots 630 and the ligands 624 of the oxygen scavenging nanoparticles 620 may cross link with each other and with charge transport molecules 642 in a charge transport matrix 640. Examples of ligands 624 and 634 may include 8-((3-ethyloxetan-3-yl)methoxy)octanoic acid, 8-((4-vinylbenzyl)oxy)octanoic acid, 8-((4-vinylbenzyl)oxy)octane-1-thiol and 8-((3-ethyloxetan-3-yl)methoxy)octane-1-thiol. The emissive layer 608 may provide additional benefits in terms of charge transport, operating voltage and device efficiency.

FIGS. 7A-7F are schematic cross-sectional views showing production of portions of a light-emitting device produced in accordance with an exemplary method of the present disclosure.

Figure 7A:
FIGS. 7A-7F are schematic cross-sectional views showing production of portions of a light-emitting device produced in accordance with an exemplary method of the present disclosure.
Figure 7B:
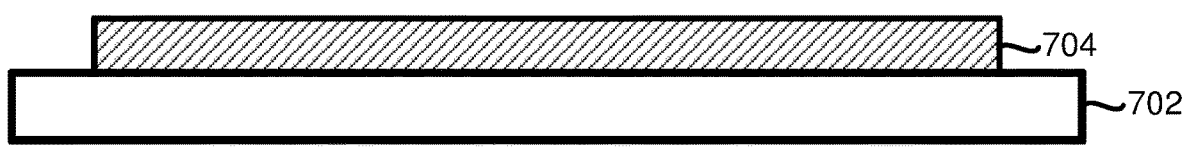

As shown in FIG. 7A, a substrate 702 is provided. As shown in FIG. 7B, an electrode 704 is deposited on the substrate 702. The electrode 704 may be deposited on the substrate using any suitable method. Examples include sputtering, evaporative coating, printing, chemical vapor deposition, and the like. As described above, the deposited electrode may be provided in any suitable form. One exemplary implementation is an electrode for a TFT circuit.

Figure 7C:
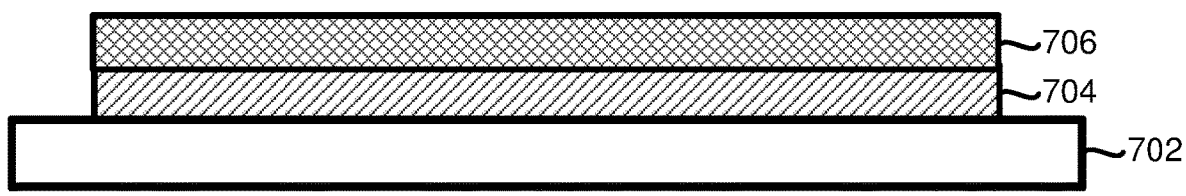

As shown in FIG. 7C, a charge transport layer 706 is formed on the electrode 704. The charge transport layer 706 may include one or more charge transport materials. In some implementations, the charge transport layer 706 may be a hole transport layer. In some implementations, the charge transport layer 706 may be an electron transport layer.

Figure 7D:
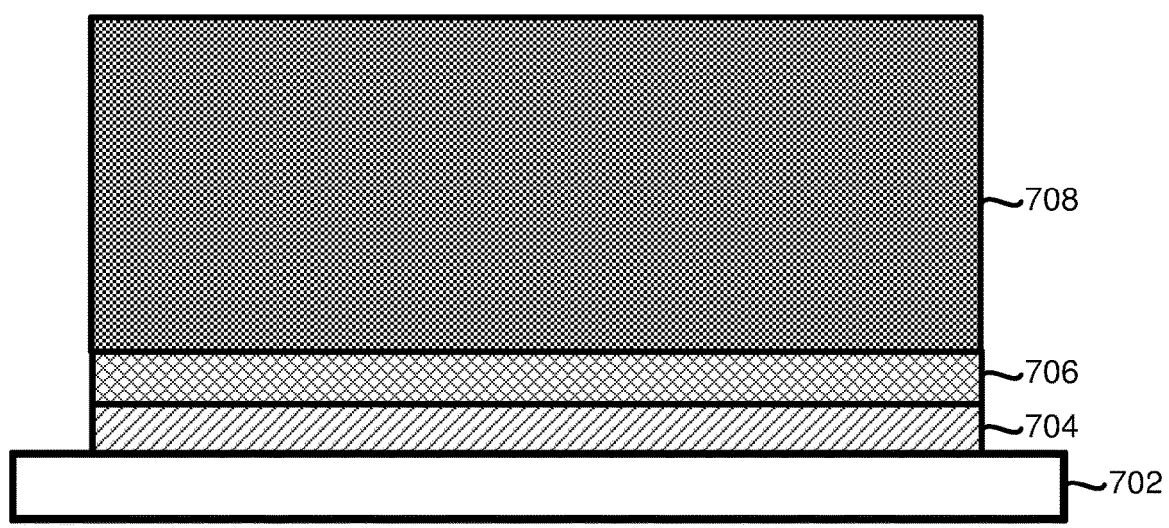

As shown in FIG. 7D, an emissive layer 708 is formed on the charge transport layer 706. In some implementations, the emissive layer 708 may correspond to the emissive layer 308 in FIG. 3, the emissive layer 408 in FIG. 4A, the emissive layer 508 in FIG. 5, or the emissive layer 608 in FIG. 6. Because the emissive layer 708 includes oxygen scavenging nanoparticles, the oxygen scavenging nanoparticles allow the processing of the light emitting device in an air environment. In some implementations, the oxygen scavenging nanoparticles may include one or more iron based materials. In some implementations, the oxygen scavenging nanoparticles may include one or more organic polymer based materials. The oxygen scavenging nanoparticles may capture oxygen in the air environment, and prevent the quantum dots from oxidation. The oxygen scavenging nanoparticles may become passive after being oxidized, and do not interfere with normal operations of the light emitting device.

It should be understood that, the environment, in which a light emitting device according to various implementations of the present application can be processed, is not limited to a pure air environment. In some implementations, the environment may include air, but not pure air. For example, the light emitting device may be processed in nitrogen gas with some air present due to gas mixing (e.g., in a "nitrogen blanket" where nitrogen gas is flowed over the surface of the emissive layer to form a "blanket" between the surface and the air above).

Figure 7E:
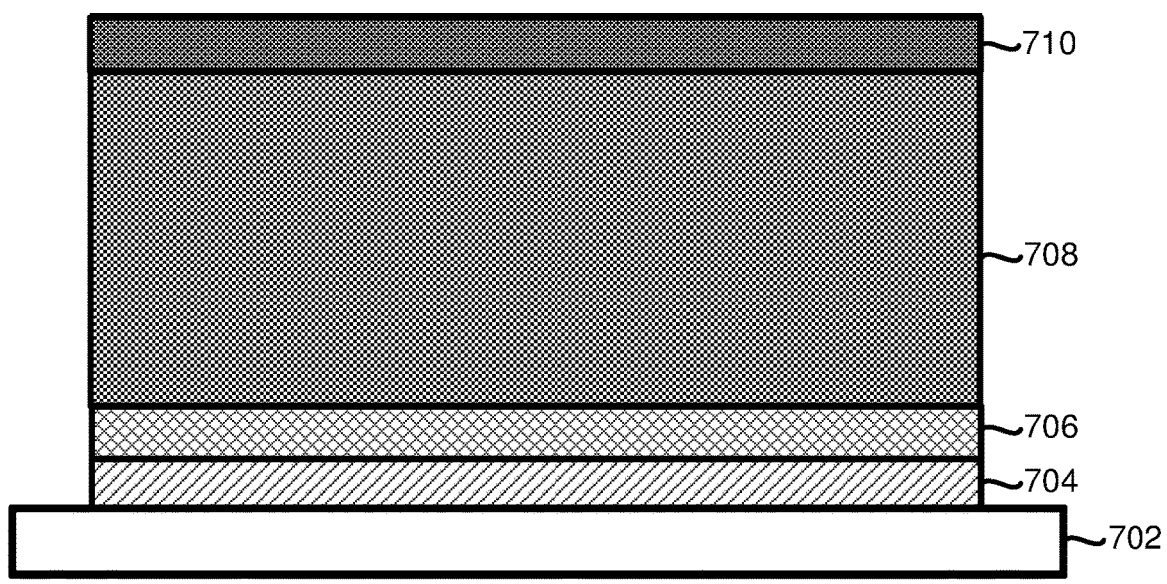

As shown in FIG. 7E, a charge transport layer 710 is formed on the emissive layer 708. The charge transport layer 710 may include one or more charge transport materials. In some implementations, the charge transport layer 710 may be an electron transport layer. In some implementations, the charge transport layer 710 may be a hole transport layer.

Figure 7F:
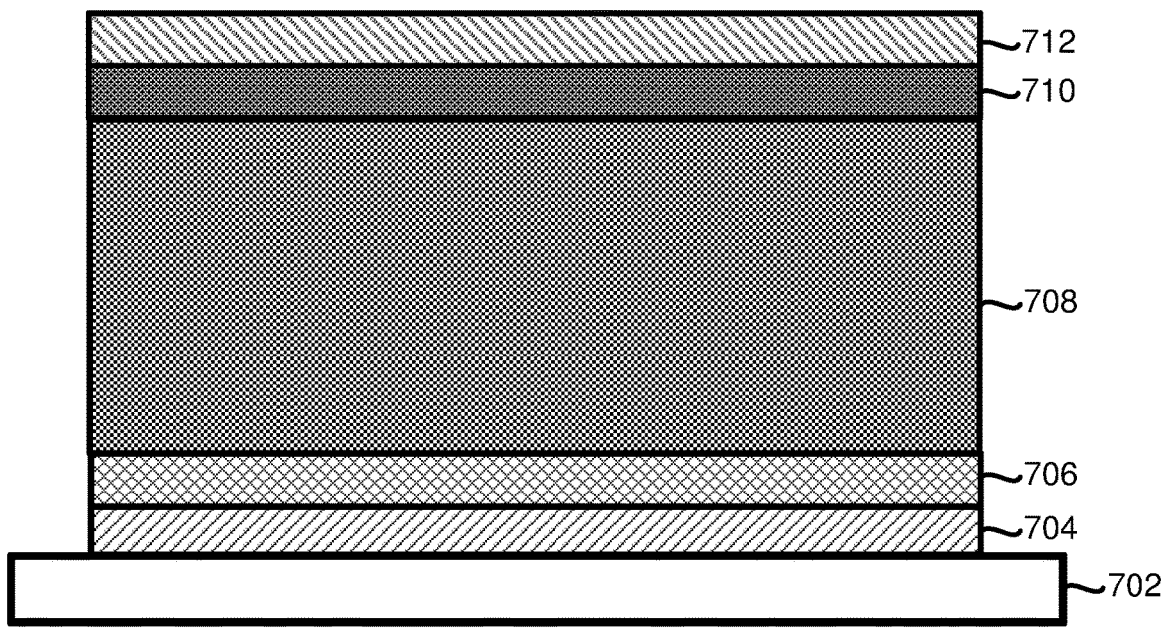

As shown in FIG. 7F, another electrode may be formed on the upper surface of the charge transport layer 710. The electrode may be formed by a method such as, but not limited to, sputtering, printing, chemical vapor deposition, and the like. As such, the structure may form a light-emitting device have the structure shown in FIG. 1.

From the above description, it is manifested that various techniques may be used for implementing the concepts described in the present application without departing from the scope of those concepts. Moreover, while the concepts have been described with specific reference to certain implementations, a person of ordinary skill in the art may recognize that changes may be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

What is claimed is:

1. A light emitting device comprising:
   a first electrode;
   a second electrode;
   an emissive layer between the first and second electrodes;
   wherein the emissive layer comprises quantum dots and oxygen scavenging nanoparticles.

2. The light emitting device of claim 1, wherein the oxygen scavenging nanoparticles comprise one or more iron based materials.

3. The light emitting device of claim 1, wherein the oxygen scavenging nanoparticles comprise one or more organic polymer based materials.

4. The light emitting device of claim 1, wherein the oxygen scavenging nanoparticles become passive after being oxidized, and do not interfere with normal operations of the light emitting device.

5. The light emitting device of claim 1, further comprising an electron injection layer disposed between the first electrode and the emissive layer, wherein the first electrode is a negative electrode.

6. The light emitting device of claim 1, further comprising a hole injection layer disposed between the second electrode and the emissive layer, wherein the second electrode is a positive electrode.

7. The light emitting device of claim 1, further comprising an electron transport layer disposed between the first electrode and the emissive layer, wherein the first electrode is a negative electrode.

8. The light emitting device of claim 1, further comprising a hole transport layer disposed between the second electrode and the emissive layer, wherein the second electrode is a positive electrode.

9. The light emitting device of claim 1, wherein the oxygen scavenging nanoparticles are phase separated from the quantum dots in the emissive layer.

10. The light emitting device of claim 1, wherein the oxygen scavenging nanoparticles and the quantum dots are randomly dispersed in the emissive layer.

11. The light emitting device of claim 1, wherein the quantum dots and the oxygen scavenging nanoparticles are arranged in an electron transporting organic matrix in the emissive layer.

12. The light emitting device of claim 1, wherein the quantum dots and the oxygen scavenging nanoparticles are arranged in a hole transporting organic matrix in the emissive layer.

13. The light emitting device of claim 1, wherein:
   the emissive layer further comprises one or more hole transporting molecules;
   the quantum dots and the oxygen scavenging nanoparticles are cross-linked to one another and with at least one of the one or more hole transporting molecules.

14. The light emitting device of claim 1, wherein:
   the emissive layer further comprises one or more electron transporting molecules;
   the quantum dots and the oxygen scavenging nanoparticles are cross-linked to one another and with at least one of the one or more electron transporting molecules.

15. A light emitting device comprising:
   an anode electrode;
   a cathode electrode;
   an emissive layer in electrical contact with the anode electrode and cathode electrode;
   wherein the emissive layer comprises quantum dots and oxygen scavenging nanoparticles configured to prevent the quantum dots from oxidation.

16. The light emitting device of claim 15, wherein the oxygen scavenging nanoparticles comprise at least one of:
   one or more iron based materials; and
   one or more organic polymer based materials.

17. The light emitting device of claim 15, wherein the quantum dots and the oxygen scavenging nanoparticles are arranged in a hole transporting organic matrix in the emissive layer.

18. The light emitting device of claim 15, wherein the quantum dots and the oxygen scavenging nanoparticles are arranged in an electron transporting organic matrix in the emissive layer.

19. The light emitting device of claim 15, wherein the oxygen scavenging nanoparticles are phase separated from the quantum dots in the emissive layer.

20. The light emitting device of claim 15, wherein the oxygen scavenging nanoparticles and the quantum dots are randomly dispersed in the emissive layer.

* * * * *